(12) United States Patent
Wang et al.

(10) Patent No.: US 7,791,417 B2
(45) Date of Patent: Sep. 7, 2010

(54) MIXED-MODE PLL

(75) Inventors: Ping-Ying Wang, Hsinchu (TW); Jing-Hon Conan Zhan, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 16 days.

(21) Appl. No.: 12/349,647

(22) Filed: Jan. 7, 2009

(65) Prior Publication Data
US 2009/0174491 A1    Jul. 9, 2009

Related U.S. Application Data

(60) Provisional application No. 61/019,314, filed on Jan. 7, 2008.

(51) Int. Cl.
*H03L 7/06* (2006.01)

(52) U.S. Cl. .............................. 331/25; 331/8; 331/18
(58) Field of Classification Search ................ 331/1 A, 331/8, 10–12, 16–18, 25
See application file for complete search history.

(56) References Cited

U.S. PATENT DOCUMENTS 7,102,454 B2 *   9/2006   Sze et al. ............... 331/117 FE
7,230,504 B1 *   6/2007   Marques et al. ........ 331/117 FE

* cited by examiner

*Primary Examiner*—David Mis
(74) *Attorney, Agent, or Firm*—Thomas, Kayden, Horstemeyer & Risley

(57) ABSTRACT

A mixed-mode PLL is disclosed. The mixed-mode PLL comprises an analog phase correction path and a digital frequency correction path. The analog phase correction path comprises a linear phase correction unit (LPCU). The digital frequency correction path comprises a digital integral path circuit.

20 Claims, 6 Drawing Sheets

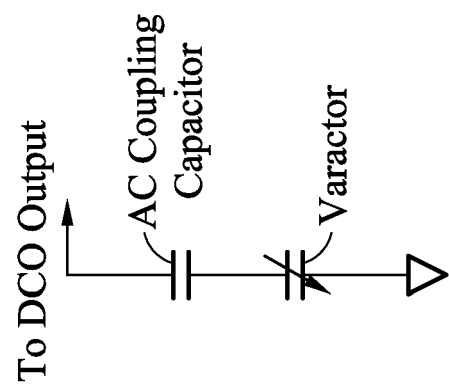
FIG. 2A-3
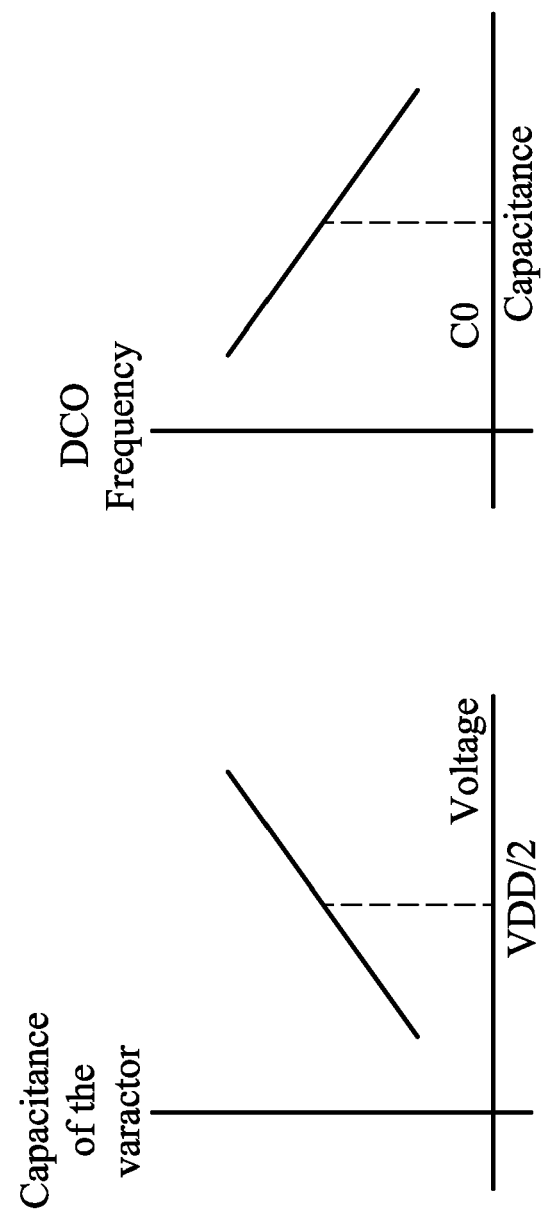
FIG. 2A-2
FIG. 2A-1

MIXED-MODE PLL

CROSS REFERENCE TO RELATED APPLICATIONS

This application claims the benefit of U.S. Provisional Application No. 61/019,314, filed on Jan. 7, 2008, the contents of which are incorporated herein by reference.

BACKGROUND OF THE INVENTION

1. Field of the Invention

The invention relates to a phase locked loop (PLL) and, in particular, to a mixed-mode PLL insensitive to quantization error.

2. Description of the Related Art

A digitally controlled oscillator-based (DCO-based) phase locked loop (PLL) uses a scalable digital loop filter which not only eliminates noise induced by gate oxide leakage but also digitally calibrates output frequency through a digital loop filter. However, this PLL is still limited to integer-N operations, because quantization errors of a digital PFD increases noise and spur in fractional-N operations.

Quantization errors of a time to digital converter (TDC) can not be shaped to a higher frequency domain such that the loop bandwidth is required to be set narrower, to suppress quantization errors and out-of-band noises. However, the in-band noises induced by the TDC still can not be filtered by the loop. Moreover, less DCO noise is filtered by the loop due to the narrower loop bandwidth, and in-band phase noise is thus consequently increased.

Non-linearity of the loop includes loop gain variation and mismatch for positive and negative phase error induced by quantization errors and meta-stabilities of the TDC. Gain mismatch and variation, induce fractional spurs when a high order of SDM is used to eliminate idle tone of fractional channels. A digital loop filter or a digital algorithm cannot eliminate the induced spurs since the quantization itself can not be cancelled by only using a digital algorithm.

Quantization errors of a DCO cannot be filtered by the loop because the noise transfer function of the DCO is a high pass filter, even when a high speed sigma delta modulator is used to obtain fine frequency resolution. The short-term quantization errors of the DCO is sampled back to the loop and amplified due to gain variation of the TDC, resulting in spurs. Meanwhile, a digitally-implemented ring type TDC must be used to achieve both large dynamic range and fine resolution for the delta-sigma fractional-N operation. The digitally-implemented ring type TDC is more sensitive to the power supply due to the ring based design, because the high frequency noises induced by power noise of TDC are aliased to a low frequency domain, which cannot be filtered by the loop.

BRIEF SUMMARY OF THE INVENTION

An embodiment of a mixed-mode PLL comprises an analog phase correction path and a digital frequency correction path. The analog phase correction path comprises a linear phase correction unit (LPCU). The digital frequency correction path comprises a digital integral path circuit.

An embodiment of a linear phase correction unit (LPCU) for a phase locked loop (PLL) comprises a bias circuit, a varactor having two ends thereof coupled to the bias circuit, and a current source circuit dynamically providing a pull-up current or a pull-down current to the bias circuit.

An embodiment of a linear phase correction unit (LPCU) for a phase locked loop (PLL) comprises first and second bias circuits, a varactor having two ends thereof respectively coupled to the first and second bias circuits, and first and second current source circuits dynamically providing a pull-up current or a pull-down current respectively to the first and second bias circuits.

An embodiment of a linear phase correction unit (LPCU) for a phase locked loop (PLL) comprises a varactor having two ends. One and the other ends of the varactor are respectively controlled by a phase up signal and a phase down signal of a phase frequency detector (PFD)

The invention provides a DCO-based fractional-N PLL to eliminate the noise and spur by replacing the noisy TDC with a linear phase correction unit which has good PSRR and lower transient noise. The digital integral path is maintained to keep the benefits of using digital capacitors. The DCO-based fractional-N PLL is insensitive to non-linearity and quantization errors of the DCO to make the DCO design robust. The architecture not only has lower phase noise but also twice the loop bandwidth as that of conventional ones and is fractional spur-free.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 2A and 2B are respectively schematic diagrams of a linear phase correction unit (LPCU) according to an embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
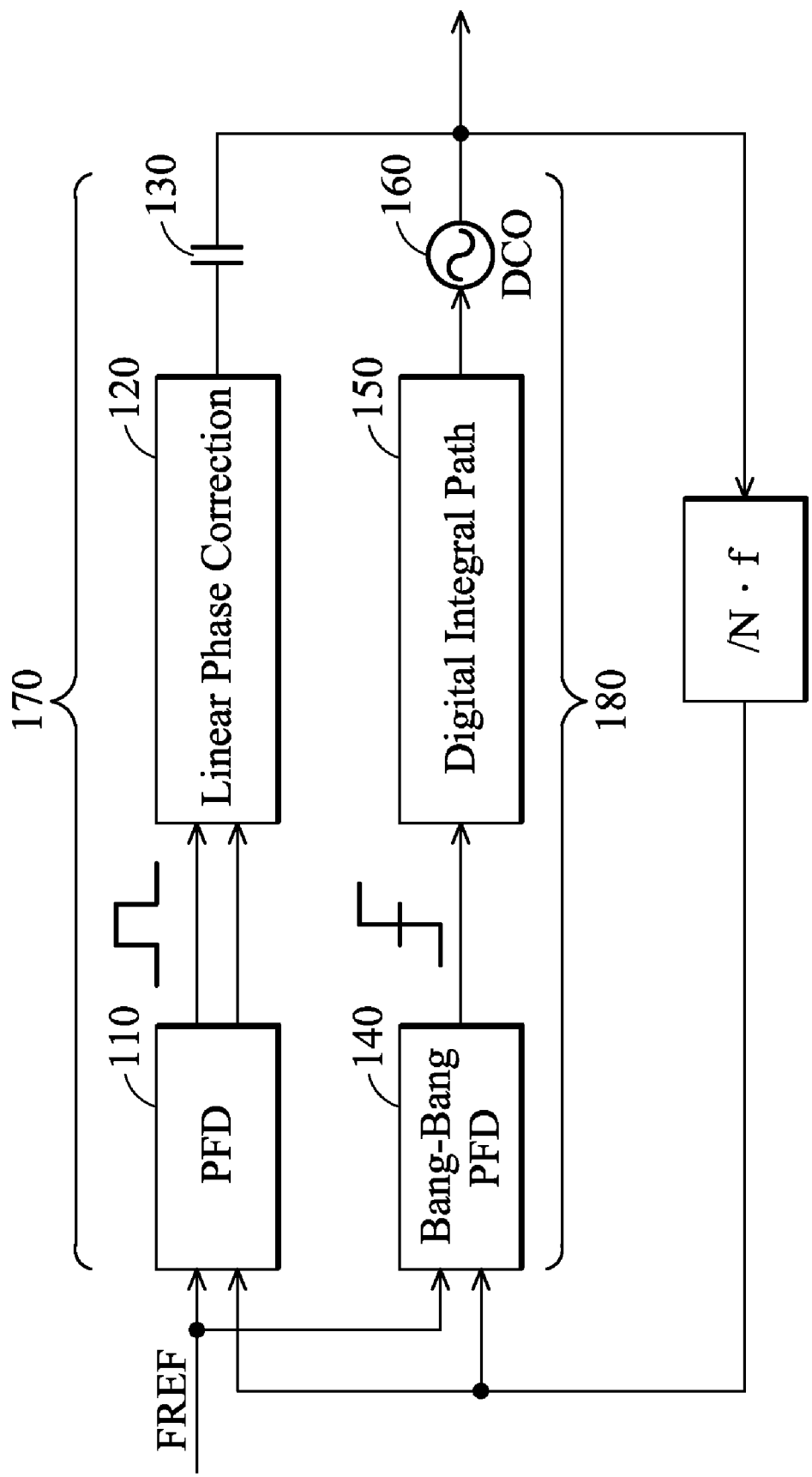
FIG. 1 is a block diagram of a mixed-mode PLL according to an embodiment of the invention.

FIG. 1 is a block diagram of a mixed-mode PLL according to an embodiment of the invention. The mixed-mode PLL comprises an analog phase correction path 170 and a digital frequency correction path 180. The analog phase correction path 170 comprises a conventional phase frequency detector (PFD) 110 and a linear phase correction unit (LPCU) 120, which is coupled to a digital controlled oscillator (DCO) output by an AC coupling capacitor 130. The LPCU 120 corrects phase in a time domain generated by a conventional PFD 110 and thus avoids all the noise and spur induced by a time to digital converter (TDC) and a DCO 160. Specifically, the DCO 160 can be a ring oscillator or a LC oscillator. The digital frequency correction path 180 comprises a bang-bang PFD 140, a digital integral path circuit 150 coupled to the bang-bang PFD 140, and a DCO 160 coupled to the digital integral path circuit 150. In the digital frequency correction path 180, frequency of the reference clock FREF is sampled by the bang-bang PFD 140 and integrated in a digital capacitor. The LPCU 120 and the bang-bang PFD 140 eliminate the need for a TDC used in a conventional all digital phase locked loop (ADPLL) to reduce transient and switching noise.

Figures 1, 2B:
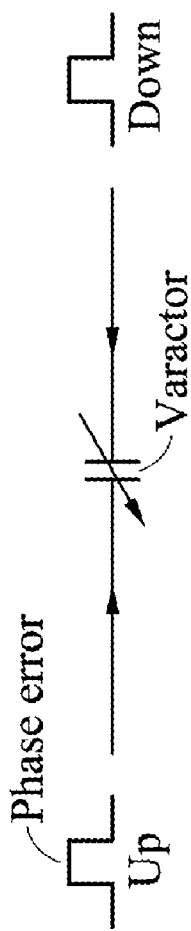
Figures 2, 2B, 3:
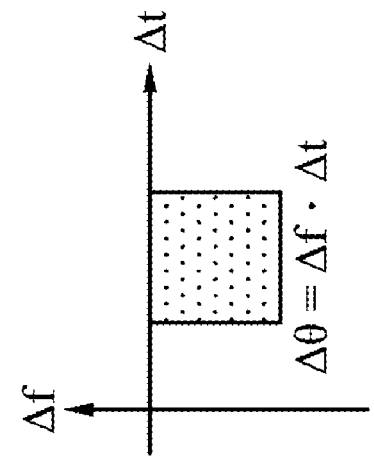
Figures 2, 2B:
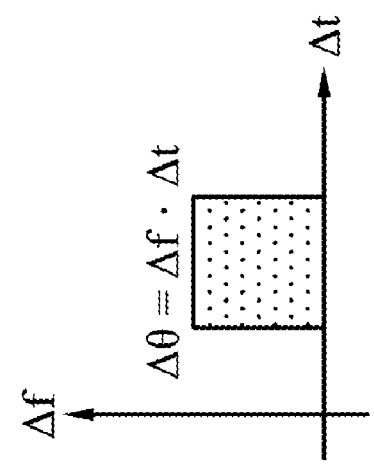
Figure 3:
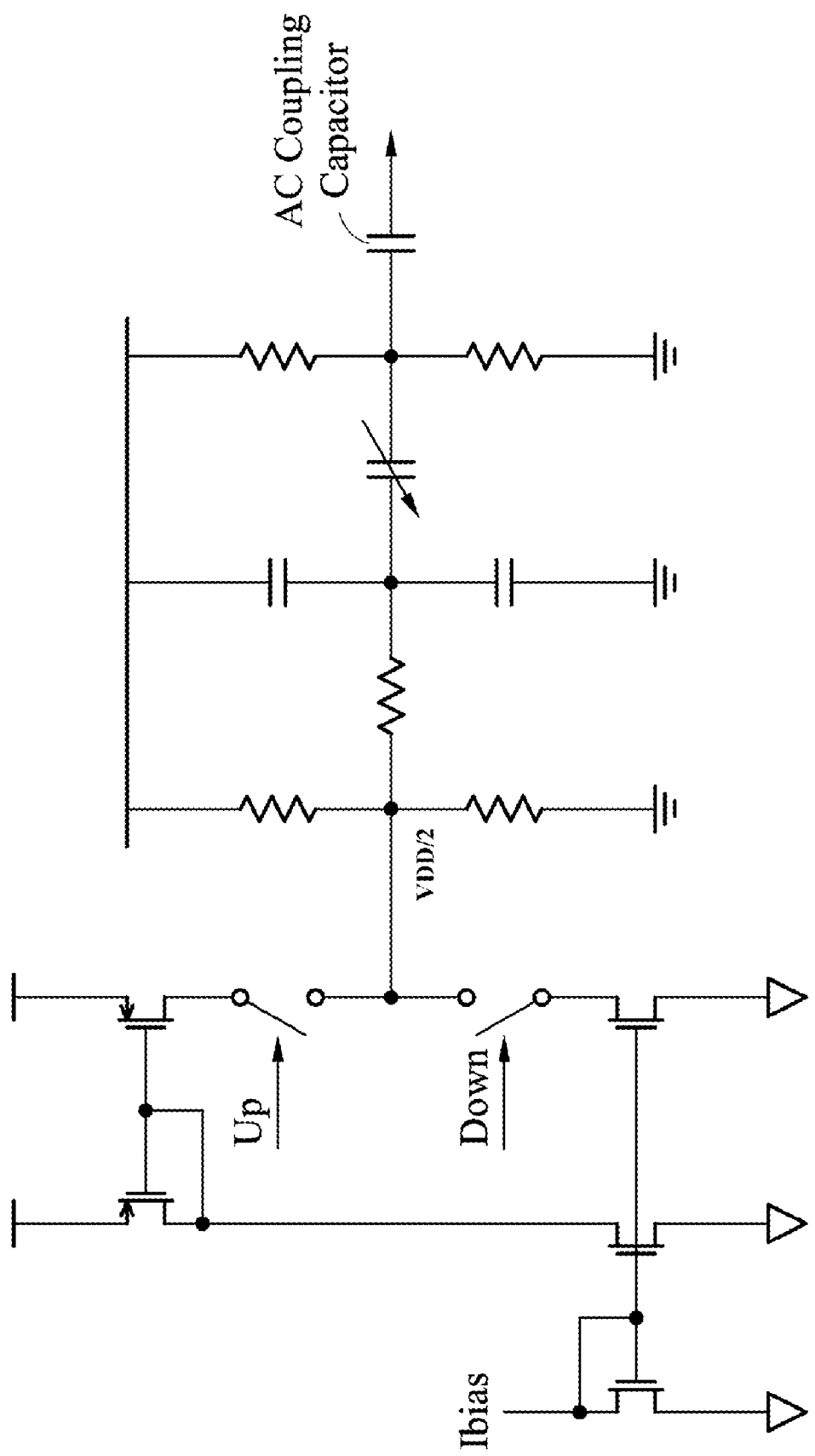
FIG. 3 is a detailed circuit diagram of an LPCU according to an embodiment of the invention.

FIGS. 2A-3 and 2B-1 are respectively schematic diagrams of a linear phase correction unit (LPCU) according to an embodiment of the invention. The LPCU 120 uses a phase error signal generated by a conventional PFD 110 whose pulse width is proportional to the phase error, to change the capacitance of the varactor by controlling the voltage on the varactor. The relationships between frequency, capacitance and control voltage of the LPCU 120 are shown in FIGS. 2A-1 and 2A-2. The phase correction is linearly proportional to the phase error because the frequency change of the DCO is linearly proportional to capacitance change as shown in FIGS. 2B-2 and 2B-3.

FIG. 3 is a detailed circuit diagram of an LPCU according to an embodiment of the invention. A common mode of the LPCU is biased at VDD/2 by a resistive voltage divider to provide good power to signal rejection ratio (PSRR). A current driver is used instead of a voltage driver to obtain a higher gain with good PSRR and a low pass filter (LPF) is added to filter out transient ripple. The circuits can use a thin oxide device to take advantage of the advanced process technology because the thin oxide device has immunity to thin gate oxide leakage.

Figure 4:
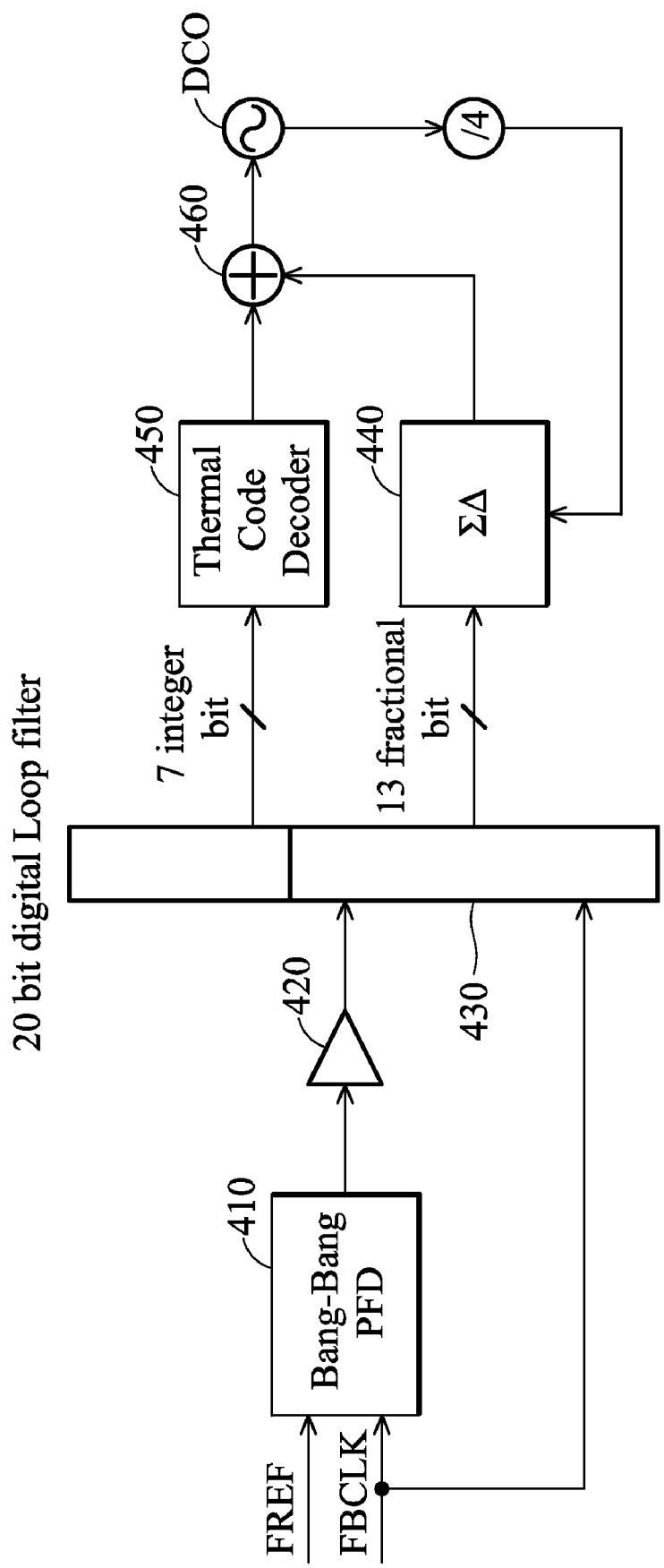
FIG. 4 is a block diagram of the digital integral path circuit according to an embodiment of the invention.

FIG. 4 is a block diagram of the digital integral path circuit according to an embodiment of the invention. The digital integral path circuit has a variable gain amplifier 420 with 4-bit gain control, a 20-bit digital loop filter 430, a 13-bit delta-sigma modulator (SDM) 440, an edge detector 460 and a 7-bit thermal code decoder 450. A five Hz effective frequency resolution is achieved by a 900 MHz SDM to dither the fractional capacitor which has the same capacitance as the integer bit. The monotonicity of frequency is maintained because the integer bit is controlled by the thermal code and the fractional bit tracks the latest transient bit of the thermal code by the edge decoder 460. The effective capacitance of the digital loop filter 430 is up to several nF in fractional-N mode by using a bang-bang operation with five Hz step, so that the gain variation induced by the bang-bang operation in the digital integral path circuit has no impact on the loop bandwidth.

Figure 5:
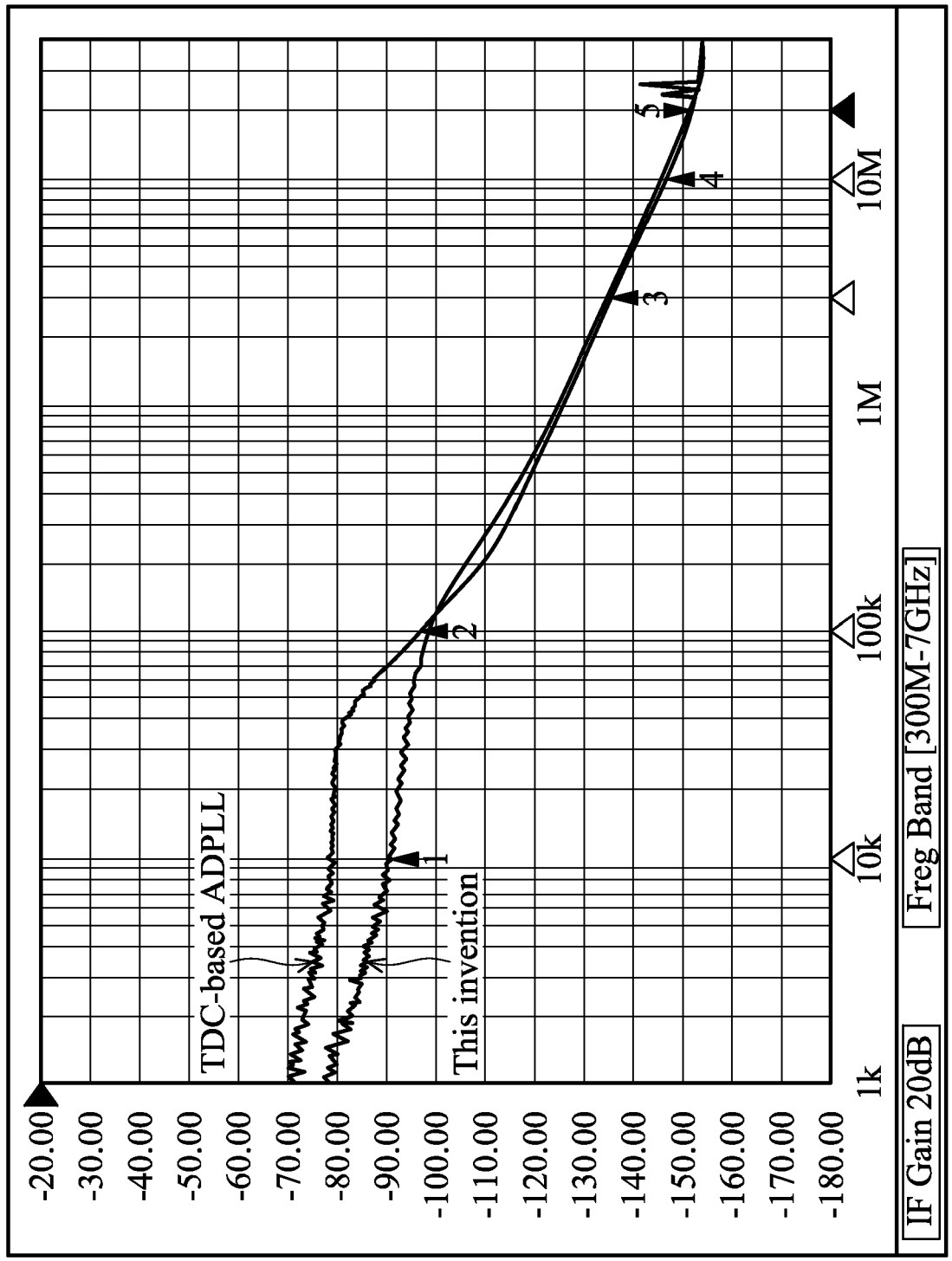
FIG. 5 is a diagram showing comparisons of phase noise between a conventional TDC-based ADPLL and a mixed-mode PLL according to an embodiment of the invention.

FIG. 5 is a diagram showing comparisons of phase noise between a conventional TDC-based ADPLL and a mixed-mode PLL according to an embodiment of the invention. It is illustrated that the in-band noise of the design of the invention is 10 dB lower than the conventional ADPLL and the latest reported ADPLL. All fractional spurs are under the phase noise floor and is 9 dB lower than that of the ADPLL when both quantization errors of the DCO are 20 KHz and the fractional code is 400 KHz. Thus, the design of the invention has larger tolerance to the quantization error of DCO while having the advantages of ADPLL, such as a fine-resolution digital calibration for loop bandwidth calibration and a scalable loop filter.

Performance of an embodiment of the invention is compared with another prior work and results thereof are shown in table I. Although the 90 nm process can provide higher resolution TDC as compared to our 130 nm process, our architecture has 5 to 10 dB less phase noise from in-band to the 1 MHz offset. The silicon prototype was fabricated using a 130 nm CMOS process and occupied 0.85 mm² with 40 mA current consumption at 1.5V.

TABLE I

|  | TI | The invention | Unit |
|---|---|---|---|
| Process | 90 nmCMOS | 130 nmCMOS |  |
| Closed-loop bandwidth | 40 | 90 | KHz |
| Fractional Spur | N/A | <−75 | dBc |
| Reference Spur | N/A | −86 | dBc |
| Phase noise |  |  |  |
| In-band | −93 | −102.7 | dBc/Hz |
| @100 KHz | −106 | −110 | dBc/Hz |
| @400 KHz | −122 | −127.6 | dBc/Hz |
| @1 MHz | −129 | −136 | dBc/Hz |
| @20 MHz | −165 | −163 | dBc/Hz |
| Current consumption |  |  |  |
| DCO |  | 18 | 20 | mA |
| PLL |  | N/A | 40 | mA |

The invention provides a DCO-based fractional-N PLL to eliminate noise and spur by replacing a noisy TDC with a linear phase correction unit which has good PSRR and lower transient noise. The digital integral path is maintained to keep the benefits of using digital capacitors. The DCO-based fractional-N PLL is insensitive to non-linearity and quantization errors of the DCO to make the DCO design robust. The architecture not only has lower phase noise but also twice the loop bandwidth as that of conventional ones and is fractional spur-free.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A mixed-mode PLL, comprising:
   an analog phase correction path comprising a linear phase correction unit (LPCU); and
   a digital frequency correction path comprising a digital integral path circuit,
   wherein the digital frequency correction path tracks frequency of a reference clock in a digital domain and the linear phase correction unit generates a phase error signal to change a phase of an output of the digital frequency correction path.

2. The mixed-mode PLL as claimed in claim 1, wherein the digital frequency correction path further comprises a bang-bang phase frequency detector (PFD) coupled to the digital integral path circuit.

3. The mixed-mode PLL as claimed in claim 1, wherein the digital frequency correction path further comprises a digital controlled oscillator (DCO) coupled to the digital integral path circuit.

4. The mixed-mode PLL as claimed in claim 3, wherein the DCO is a ring oscillator or a LC oscillator.

5. The mixed-mode PLL as claimed in claim 3, wherein the DCO is controlled by the digital integral path circuit and the LPCU.

6. The mixed-mode PLL as claimed in claim 5, wherein the DCO has two inputs respectively coupled to the digital integral path circuit and the LPCU.

7. The mixed-mode PLL as claimed in claim 1, further comprising an AC coupling capacitor coupled between the LPCU and the digital frequency correction path.

8. The mixed-mode PLL as claimed in claim 1, wherein the analog phase correction path further comprises a phase frequency detector (PFD) coupled to the LPCU.

9. The mixed-mode PLL as claimed in claim 8, wherein the LPCU comprises a varactor coupled to and controlled by the PFD.

10. The mixed-mode PLL as claimed in claim 8, wherein the LPCU comprises a bias circuit, a varactor having two ends thereof coupled to the bias circuit, and a current source circuit dynamically providing a pull-up current or a pull-down current to the bias circuit.

11. The mixed-mode PLL as claimed in claim 10, wherein the bias circuit comprises a low pass filter (LPF) circuit.

12. The mixed-mode PLL as claimed in claim 8, wherein the LPCU comprises first and second bias circuits, a varactor having two ends thereof respectively coupled to the first and second bias circuits, and first and second current source circuits dynamically providing a pull-up current or a pull-down current respectively to the first and second bias circuits.

13. The mixed-mode PLL as claimed in claim 12, wherein the first and second bias circuits have same configurations and the first and second current source circuits have same configurations.

14. The mixed-mode PLL as claimed in claim 12, wherein at least one of the first and second bias circuits comprises a low pass filter (LPF) circuit.

15. A linear phase correction unit (LPCU) for a phase locked loop (PLL), comprising:
a bias circuit;
a varactor having two ends thereof coupled to the bias circuit; and
a current source circuit dynamically providing a pull-up current or a pull-down current to the bias circuit.

16. The linear phase correction unit (LPCU) as claimed in claim 15, wherein the bias circuit comprises a low pass filter (LPF) circuit.

17. A linear phase correction unit (LPCU) for a phase locked loop (PLL), comprising:
first and second bias circuits;
a varactor having two ends thereof respectively coupled to the first and second bias circuits; and
first and second current source circuits dynamically providing a pull-up current or a pull-down current respectively to the first and second bias circuits.

18. The linear phase correction unit (LPCU) as claimed in claim 17, wherein the first and second bias circuits have same configurations and the first and second current source circuits have same configurations.

19. The linear phase correction unit (LPCU) as claimed in claim 17, wherein at least one of the first and second bias circuits comprises a low pass filter (LPF) circuit.

20. A linear phase correction unit (LPCU) for a phase locked loop (PLL), comprising:
a varactor having two ends,
wherein one and the other ends of the varactor are respectively controlled by a phase up signal and a phase down signal of a phase frequency detector (PFD).

* * * * *